United States Patent
Takada et al.

Patent Number: 5,229,035
Date of Patent: Jul. 20, 1993

[54] BI-PB-SR-CA-CU-O SYSTEM SUPERCONDUCTORS

[75] Inventors: Toshio Takada; Mikio Takano, both of Kyoto; Yoshinari Miura, Hyogo; Jun Takada; Kiichi Oda, both of Okayama; Naoichi Yamamoto, Osaka, all of Japan

[73] Assignees: Toda Kogyo Corporation, Hiroshima; NEC Corporation, Tokyo; Tosoh Corporation, Yamaguchi; Osaka Cement Co., Ltd., Osaka; Kabushiki Kaisha Kobe Seiko Sho, Hyogo; Seisan Kaihatsu Kagaku Kenkyusho, Kyoto, all of Japan

[21] Appl. No.: 706,449

[22] Filed: May 28, 1991

Related U.S. Application Data

[63] Continuation-in-part of Ser. No. 533,092, Jun. 4, 1990, abandoned.

[30] Foreign Application Priority Data

Jun. 2, 1989 [JP] Japan .................. 1-141418
Jun. 21, 1989 [JP] Japan .................. 1-159023
May 28, 1990 [JP] Japan .................. 2-137595

[51] Int. Cl.$^5$ .............. H01B 12/06; H01L 39/12; C01G 3/00; C01B 41/89
[52] U.S. Cl. ............. 252/500; 252/518; 252/521; 505/1; 505/782; 501/123; 501/126
[58] Field of Search ........ 505/1, 782; 252/500, 252/518, 521; 501/123, 126

[56] References Cited

FOREIGN PATENT DOCUMENTS 0347770 12/1989 European Pat. Off.
367529 11/1989 Japan .................. 505/782

OTHER PUBLICATIONS

Godelaine et al., "Effects of Intergrain and Intergrain Currents on Flux Profile in Granular Superconducting Ceramics," *Solid State Comm.*, 76(6), pp. 785-788, Nov. 1990.
Yamada et al., "Pb Introduction to the High-Tc Superconductor In Bi-Si-Ca-Cu-O" Jap. Jour Appl Phys. vol. 27, No. 6, Jun. 1988.
Sato, R., "Japanese Journal of Applied Physics", 28(4), L583-L586 (Apr. 1989).
Maeda, A., "Japanese Journal of Applied Physics", 28(4), L576-L579 (Apr. 1989).
Hatano, T., "Japanese Journal of Applied Physics", 27(11), L2055-L2058 (Nov. 1988).
Takano et al., "High-Tc Phase Promoted and Stabilized in the Bi-Pb-Sr-Ca-Cu-O Systems", Jap. Journ. Appl. Phys., 27(6) L1041-L1043 (Jun. 1988).
Wang, "Resistivity and Susceptibility of the Bismuth Bed Strontium Calcium Copper Oxide high-Tc Superconductor (Bi-Pb-Sr-Co-Cu-O) Jilin Daxue Ziran Kexue Xuebao", (4) 57-60 (1988).
Dominguez et al., "Mat. Res. Soc. Symp. Proc.", 99 951-955 (1988).
Yamada et al., "J. App. Phys.", 27(6) L996-998 (Jun. 1988).
Kumakura et al., "Magnetic Properties of Pb-Doped Bi-Si-Ca-Cu-O Superconductors, Jap. Journ. Appl. Phys.", 27(8) L1514-16 (Aug. 1988) (or Chem. Abst. 110(18) 164274h (1988)).
"App. Phys. Lett.", 54(16) 1576-1578 (1989).

Primary Examiner—Mark L. Bell
Assistant Examiner—C. M. Bonner
Attorney, Agent, or Firm—Wenderoth, Lind & Ponack

[57] ABSTRACT

A Bi-Pb-Sr-Ca-Cu-O system superconductor having a composition of $$Bi_nPb_mSr_xCa_yCu_2O_\delta$$

wherein n is a number from 0.76 to 1.05, m is a number from 0.01 to 0.20, x is a number from 0.85 to 1.35 and y is a number larger than 1.00 and not larger than 1.35; or n is a number larger than 1.06 and not larger than 1.15, m is a number from 0.12 to 0.25, x is a number from 1.20 to 1.35 and y is a number from 1.20 to 1.30; or n is a number larger than 0.75 and not larger than 1.15, m is a number from 0.25 to 0.35, x is a number from 1.20 to 1.35 and y is a number from 1.20 to 1.35, when they are normalized with the Cu mole number of 2, which has $t_c$ of at least 110 K.

3 Claims, 11 Drawing Sheets

BI-PB-SR-CA-CU-O SYSTEM SUPERCONDUCTORS

This is a continuation-in-part application of Ser. No. 533,092 filed on Jun. 4, 1990, now abandoned.

BACKGROUND OF THE INVENTION

1. Field of the Invention

The present invention relates to Bi-Pb-Sr-Ca-Cu-O system superconductors which have a zero resistance critical temperature ($T_c$) of at least 107 K. or 108 K., in some cases, at least 110 K.

2. Description of the Related Art

In 1988, the researchers in the National Institute for Metals, Japan found a Bi-Sr-Ca-Cu-O system superconductor having $T_c$ of 105 K. which was obtained by extrapolation of the measured date. However, hitherto, it has been believed that it is very difficult to produce a Bi-Sr-Ca-CuO system superconductor which has $T_c$ of 105 K. or higher and contains a high $T_c$ phase in a large volume percentage with good reproducibility.

The present inventors synthesized a superconductor comprising a Bi-Sr-Ca-Cu-O system to which Pb is added and found that such new Bi-Pb-Sr-Ca-Cu-O system superconductor had $T_c$ of 107 K. However, it is still difficult to produce the Bi-Pb-Sr-Ca-Cu-O system superconductor having $T_c$ of 107 or higher and containing the high $T_c$ phase in a larger volume percentage with good reproducibility. Very few scientists have been able to synthesize such superconductor.

The Y-Ba-Cu-O system superconductor which was found in 1987, the Bi-Sr-Ca-Cu-O system superconductor and the Bi-Pb-Sr-Ca-Cu-O system superconductor have $T_c$ higher than the liquid nitrogen temperature, namely 77 K. and attract great attention worldwidely. But, it is still desired to provide a superconductor having higher $T_c$ since when difference between the liquid nitrogen temperature and $T_c$ is greater, the superconductor has better and more stable superconductive characteristics.

SUMMARY OF THE INVENTION

One object of the present invention is to provide a Bi-Pb-Sr-Ca-Cu-O system superconductor having $T_c$ of at least 110 K.

Another object of the present invention is to provide a Bi-Pb-Sr-Ca-Cu-O system superconductor which can be synthesized with good reproducibility.

These and other objects are achieved by a Bi-Pb-Sr-Ca-Cu-O system superconductor having $T_c$ of at least 110 K. and a composition of $$Bi_nPb_mSr_xCa_yCu_2O_\delta$$

wherein n is a number from 0.76 to 1.05, m is a number from 0.01 to 0.20, x is a number from 0.85 to 1.35 and y is a number larger than 1.00 and not larger than 1.35, or n is a number larger than 1.06 and not larger than 1.15, m is a number from 0.12 to 0.25, x is a number from 1.20 to 1.35 and y is a number from 1.20 to 1.30, or n is a number larger than 0.75 and not larger than 1.15, m is a number from 0.25 to 0.35, x is a number from 1.20 to 1.35 and y is a number from 1.20 to 1.35, when they are normalized with the Cu mole number of 2.

DETAILED DESCRIPTION OF THE INVENTION

Figure 1:
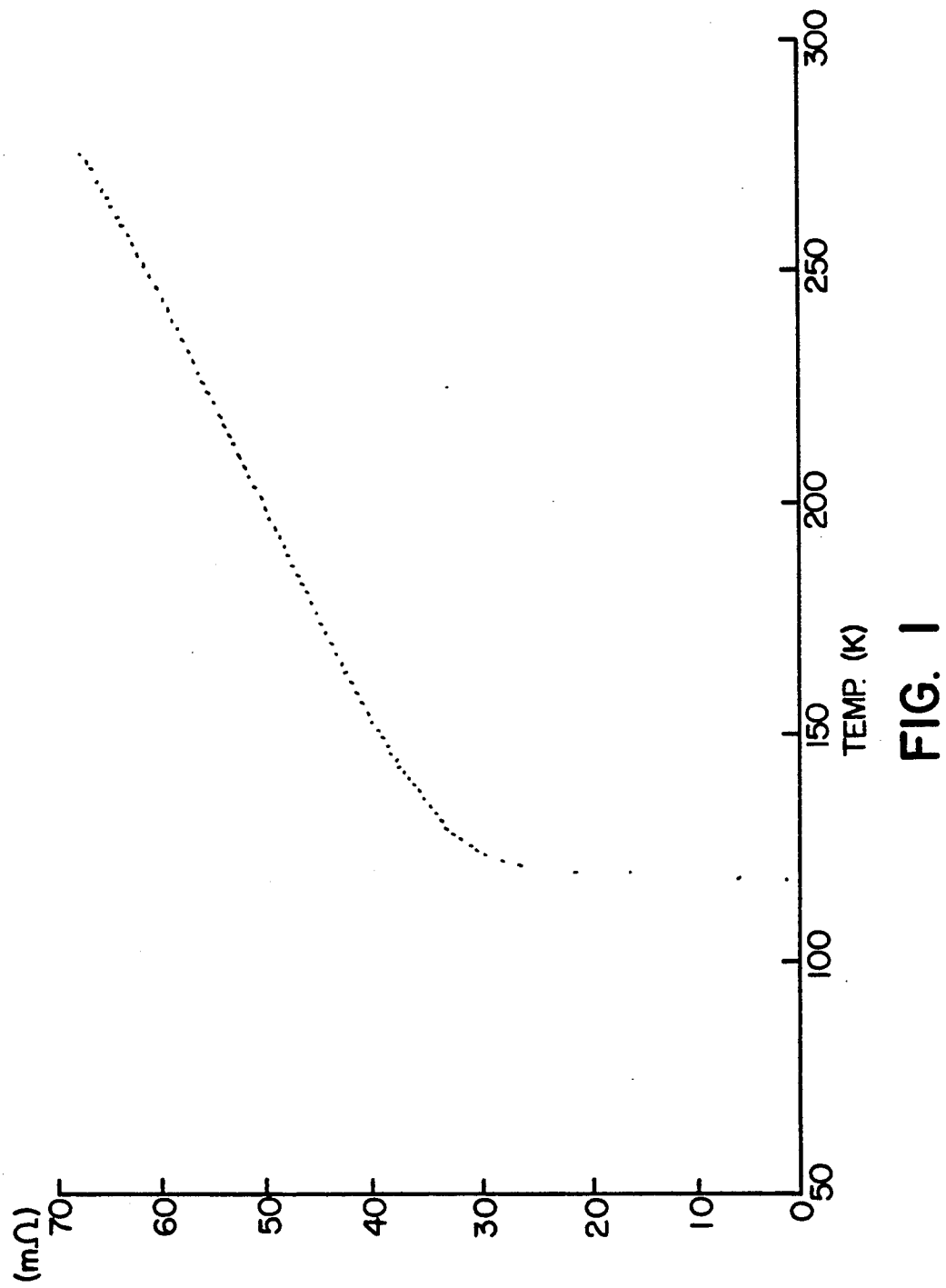
FIG. 1 is a graph showing the temperature dependence of the electrical resistance of the sample prepared in Example 1.

In the first embodiment, the Bi-Pb-Sr-Ca-Cu-O system superconductor of the present invention has a composition of $$Bi_nPb_mSr_xCa_yCu_2O_\delta$$

wherein n is a number from 0.76 to 1.05, m is a number from 0.01 to 0.20, x is a number from 0.85 to 1.35 and y is a number larger than 1.00 and not larger than 1.35. With this composition, the Bi-Pb-Sr-Ca-Cu-O system superconductor has $T_c$ of 110 K. or higher and contains the high $T_c$ phase in a larger volume percentage and can be synthesized with good reproducibility. When n is a number from 0.80 to 0.95, m is a number from 0.04 to 0.20, x is a number from 0.90 to 1.30 and y is a number larger than 1.00 and not larger than 1.30, the superconductor has $T_c$ of 110K or higher easily and contains the high $T_c$ phase in a large volume percentage.

In the second embodiment, the superconductor of the present invention has a composition of $$Bi_nPb_mSr_xCa_yCu_2O_\delta$$

wherein n is a number larger than 1.06 and not larger than 1.15, m is a number from 0.12 to 0.25, x is a number from 1.20 to 1.35 and y is a number from 1.20 to 1.30. With this composition, the Bi-Pb-Sr-Ca-Cu-O system superconductor has $T_c$ of 110K or higher and contains the high $T_c$ phase in a larger volume percentage and can be synthesized with good reproducibility. Preferably, n is a number larger than 1.05 and not larger than 1.12, m is a number from 0.15 to 0.23, x is a number from 1.25 to 1.35 and y is a number from 1.25 to 1.30.

In the third embodiment, the superconductor of the present invention has a composition of $$Bi_nPb_mSr_xCa_yCu_2O_\delta$$

wherein n is a number larger than 0.76 and not larger than 1.15, m is a number from 0.25 to 0.35, x is a number from 1.20 to 1.35 and y is a number from 1.20 to 1.35.

The superconductive compound of the present invention can be produced as follows:

First, as raw materials, $Bi_2O_3$, $SrCO_3$, $CaCO_3$, CuO and PbO are weighed in a desired molar ratio and mixed, or carboxylates such as oxalates containing Bi, Pb, Sr, Ca and Cu in a desired molar ratio are synthesized by a coprecipitation method. In this step, the molar ratio of Bi, Sr, Ca and Cu may be almost the same as that in the final product, while Pb may be used in a ratio more than that in the final product since a part of Pb is evaporated during thermal treatment.

When the mole number of Cu is 2, the preferred molar ratios of other elements in the raw material are, in the first embodiment, $$0.76 < n < 1.15,$$

$$0.25 < m < 0.60,$$

$$1.00 < x < 1.40 \text{ and}$$

$$1.00 < y < 1.40,$$

in the second embodiment, $$1.06 < n < 1.20,$$

$$0.15 < m < 0.60,$$

$$1.15 < x < 1.40 \text{ and}$$

$$1.15 < y < 1.35,$$

or in the third embodiment, $$0.76 < n < 1.20,$$

$$0.25 < m < 0.80,$$

$$1.15 < x < 1.40 \text{ and}$$

$$1.15 < y < 1.40.$$

Then, the oxide mixture or the carboxylate mixture is heated and reacted in the air at about 800° C. When the carboxylates are used, preferably the mixture is thermally decomposed at about 250° C. and then reacted at about 800° C. The heated mixture is ground and pelletized under pressure of about 500 to 1000 kg/cm². Finally, the pellet is sintered at a temperature of 845° to 865° C.

PREFERRED EMBODIMENTS OF THE INVENTION

The present invention will be illustrated by following Examples.

Example 1

To a solution of nitrates of Bi, Pb, Sr, Ca and Cu, ammonium oxalate was added to coprecipitate oxalates in which the molar ratio of Bi:Pb:Sr:Ca:Cu was 0.90:0.51:1.18:1.18:2.00. The coprecipitated oxalates were dried at 100° C., heated at 250° C. to decompose them and ground followed by heating with an electric furnace in the air at 800° C. for 12 hours. Thereafter, the mixture was again ground and pressed under pressure of about 1000 kg/cm² to produce a pellet of 20 mm in diameter and 2 mm in thickness. The pellet was sintered with the electric furnace in the air at 855° C. for 120 hours.

With the sintered sample, the molar ratio of the component elements was examined with ICAP to find that the molar ratio of Bi:Pb:Sr:Ca:Cu was 0.85:0.10:1.15:1.13:2.00 when normalized with the mole number of Cu of 2.

Figure 2:
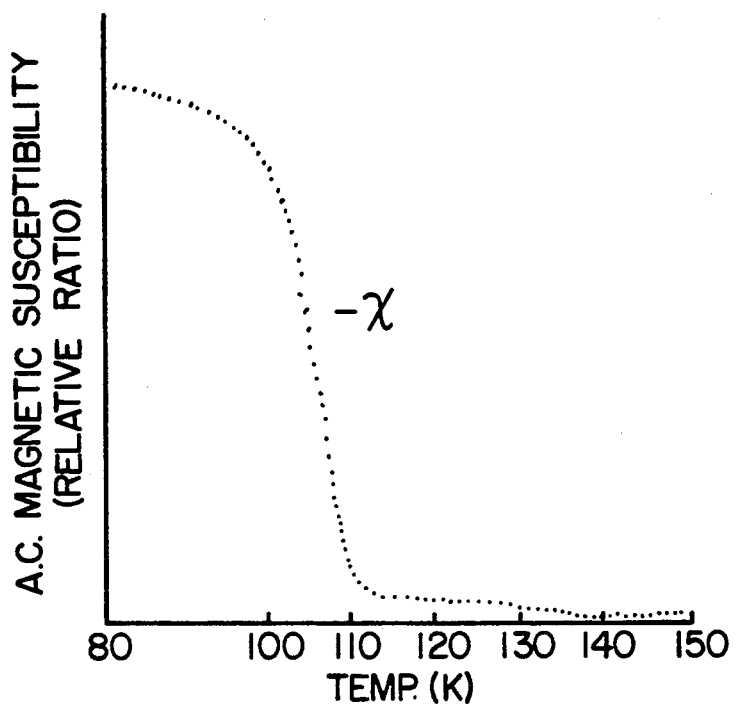
FIG. 2 shows the A.C. magnetic susceptibility of the sample prepared in Example 1.
Figure 3:
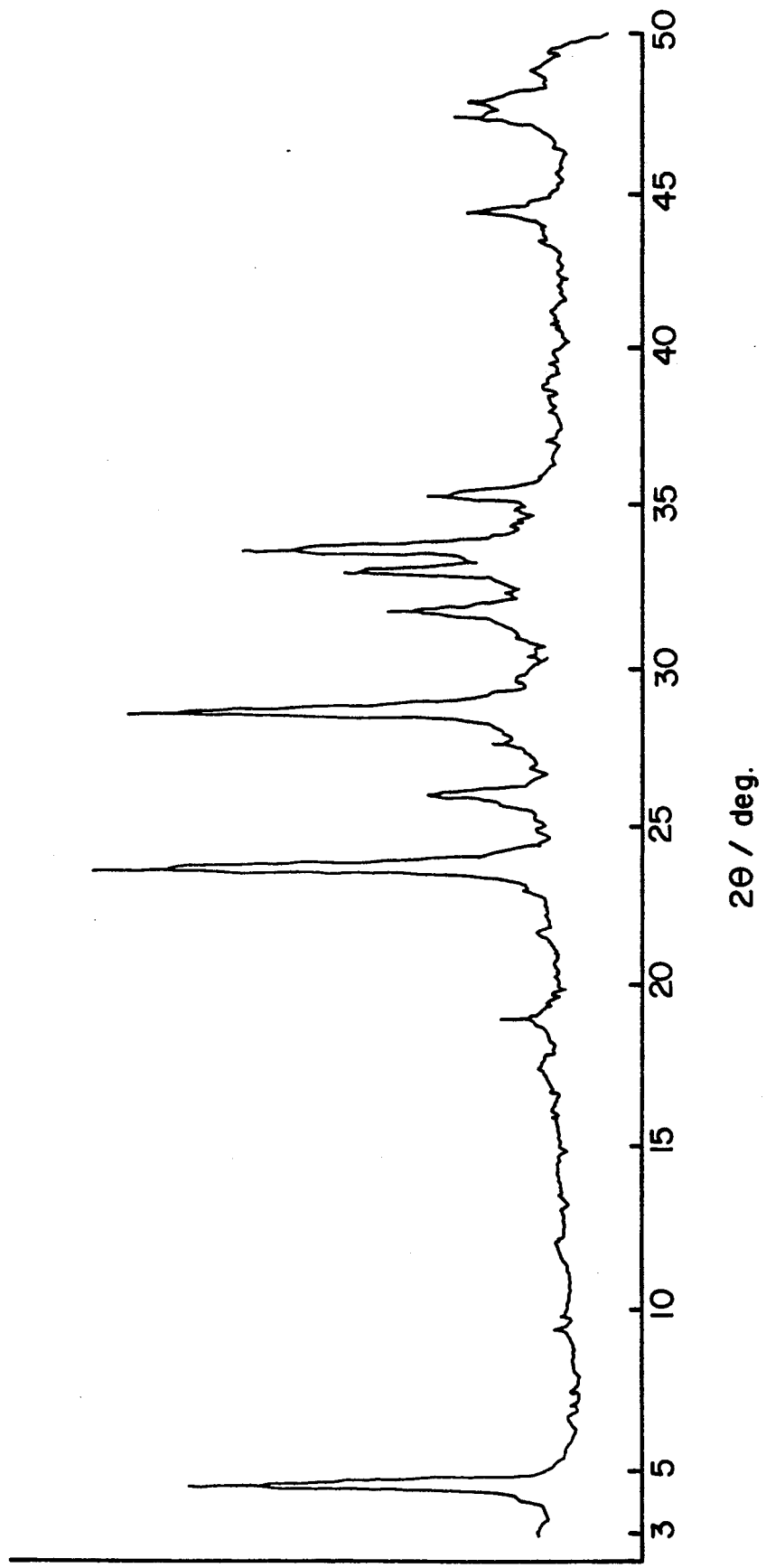
FIG. 3 shows the X-ray diffraction pattern of the sample prepared in Example 1.

The temperature dependence of the electrical resistance of this sample is shown in FIG. 1, from which it is understood that the electrical resistance quickly dropped from about 130K and reached 0 (zero) at about 115K. The A.C. magnetic susceptibility of this sample is shown in FIG. 2, which confirms that this sample could be superconductive at about 115K or higher. The X-ray diffraction pattern of this sample is shown in FIG. 3, which indicates that the percentage of the high $T_c$ phase with the c axis of 37 Å in this sample was substantially 100%.

Example 2

To a solution of nitrates of Bi, Pb, Sr, Ca and Cu, ammonium oxalate was added to coprecipitate oxalates in which the molar ratio of Bi:Pb:Sr:Ca:Cu was 0.88:0.45:1.20:1.20:2.00. The coprecipitated oxalates were dried at 100° C., heated at 500° C. to decompose them and ground followed by heating with an electric furnace in the air at 800° C. for 12 hours. Thereafter, the mixture was again ground and pressed under pressure of about 600 kg/cm² to produce a pellet of 20 mm in diameter and 2 mm in thickness. The pellet was sintered with the electric furnace in the air at 844° C. for 192 hours.

With the sintered sample, the molar ratio of the component elements was examined with ICAP to find that the molar ratio of Bi:Pb:Sr:Ca:Cu was 0.81:0.07:1.16:1.15:2.00 when normalized with the mole number of Cu of 2.

Figure 5:
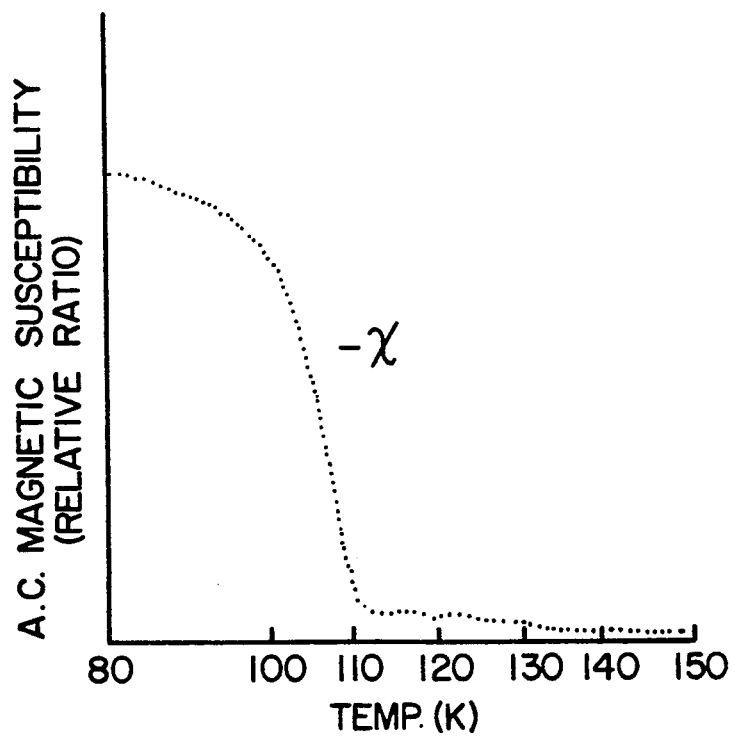
FIG. 5 shows the A.C. magnetic susceptibility of the sample prepared in Example 2.
Figure 4:
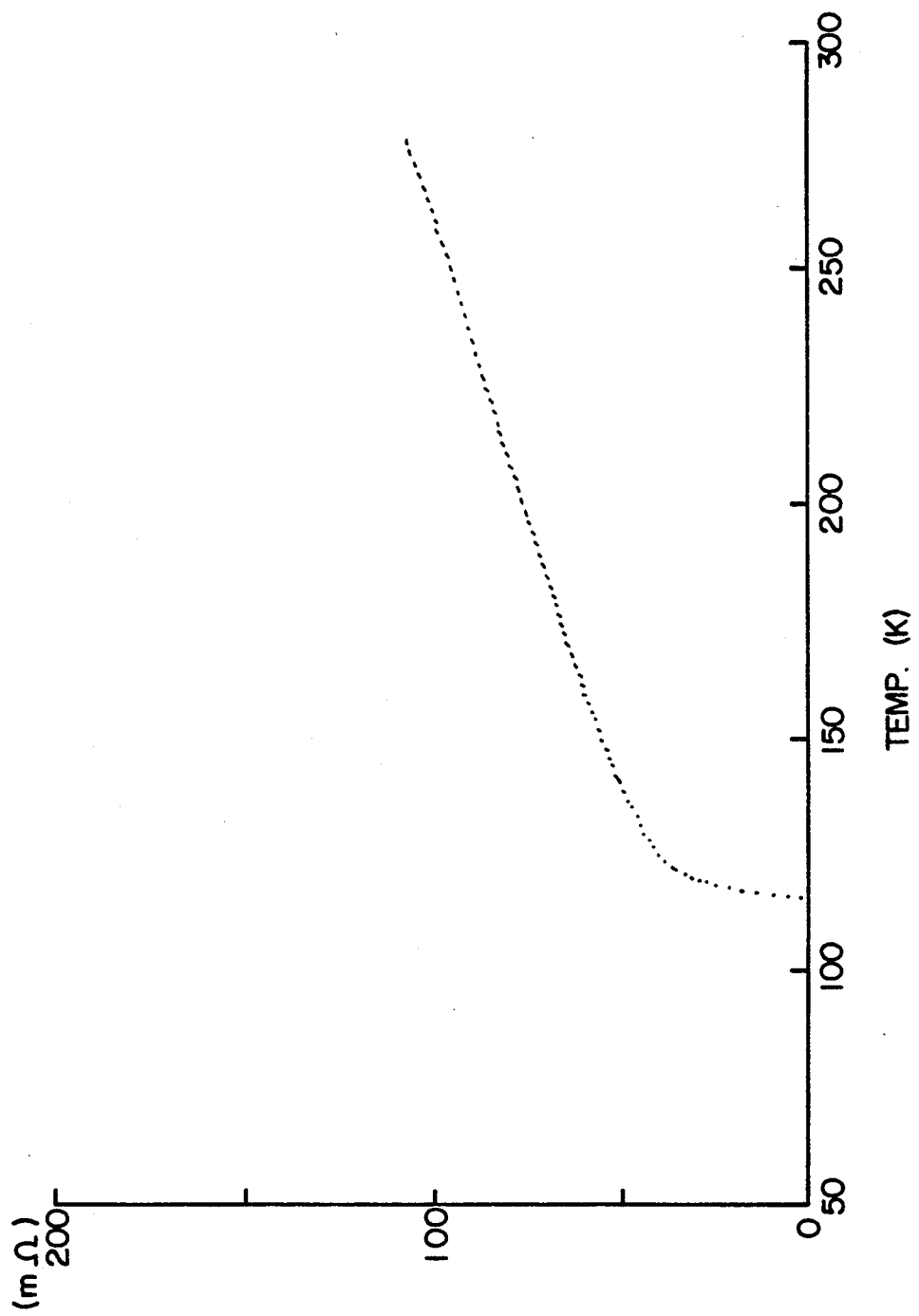
FIG. 4 is a graph showing the temperature dependence of the electrical resistance of the sample prepared in Example 2.
Figure 6:
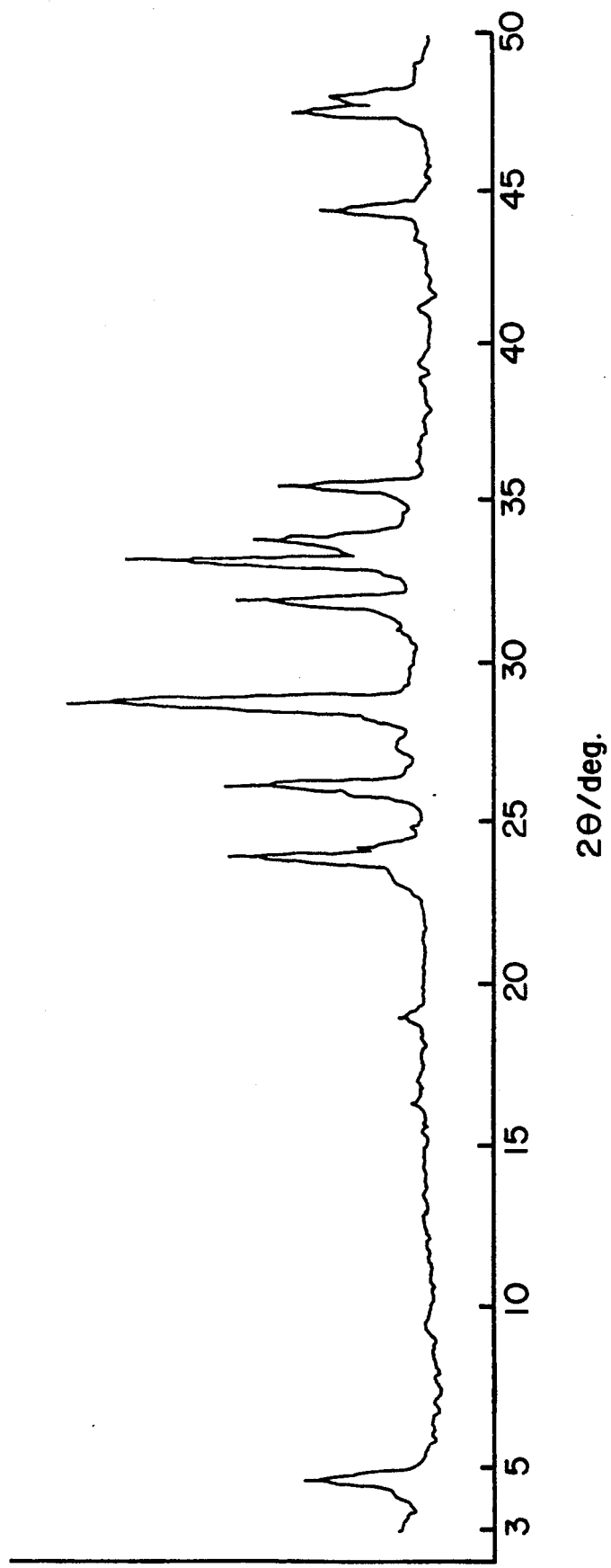
FIG. 6 shows the X-ray diffraction pattern of the sample prepared in Example 2.

The temperature dependence of the electrical resistance of this sample is shown in FIG. 4, from which it is understood that the electrical resistance quickly dropped from about 130K and reached 0 (zero) at about 114K. The A.C. magnetic susceptibility of this sample is shown in FIG. 5, which confirms that this sample could be superconductive at about 114K or higher. The X-ray diffraction pattern of this sample is shown in FIG. 6, which indicates that the percentage of the high $T_c$ phase with the c axis of 37 Å was about 90%.

Example 3

In the same manner as in Example 2 but sintering the pressed pellet at 855° C. for 120 hours, the sample was prepared in which the molar ratio of Bi:Pb:Sr:Ca:Cu was 0.82:0.09:1.17:1.15:2.00.

The zero resistance critical temperature of this sample was 112K, and the A.C. magnetic susceptibility of this sample confirmed that this sample was superconductive at about 114K or higher. The X-ray diffraction pattern of this sample indicated that the percentage of the high $T_c$ phase was about 80%.

Example 4

In the same manner as in Example 2 but coprecipitating the oxalates in the molar ratio of Bi:Pb:Sr:Ca:Cu of 1.02:0.57:1.30:1.30:2.00, the sample was prepared. According to the ICAP analysis, the molar ratio of Bi:Pb:Sr:Ca:Cu in the sample was 0.95:0.09:1.25:1.24:2.00.

The electric resistance of this sample sharply dropped from about 130K and reached 0 (zero) at 112K. The X-ray diffraction pattern of this sample indicated that the percentage of the high $T_c$ phase was larger than about 80%.

Example 5

In the same manner as in Example 3 but coprecipitating the oxalates in the molar ratio of Bi:Pb:Sr:Ca:Cu of 0.92:0.50:1.20:1.20:2.00, the sample was prepared. According to the ICAP analysis, the molar ratio of Bi:Pb:Sr:Ca:Cu in the sample was 0.87:0.07:1.17:1.15:2.00.

The electric resistance of this sample sharply dropped from about 130K and reached 0 (zero) at 112K. The X-ray diffraction pattern of this sample indicated that the percentage of the high $T_c$ phase was larger than about 80%.

Examples 6 and 7

$Bi_2O_3$, PbO, $SrCO_3$, $CaCO_3$ and CuO were weighed in a molar ratio of Bi:Pb:Sr:Ca:Cu of
1.08:0.50:1.30:1.30:2.00 (Example 6) or
0.85:0.40:1.15:1.15:2.00 (Example 7)
and ground and mixed in an agate mortar. Then, the ground mixture was placed in an alumina boat and heated and reacted with an electric furnace in the air at 800° C. for 24 hours. The mixture was again ground in the mortar and pressed under pressure of about 600 kg/cm² to produce a pellet of about 20 mm in diameter and 2 mm in thickness. The pellet was sintered with the electric furnace in the air at 855° C. for 120 hours.

With the sintered sample, the molar ratio of the component elements was examined with ICAP to find that the molar ratio of Bi:Pb:Sr:Ca:Cu was
1.01:0.18:1.27:1.25:2.00 (Example 6), or
0.80:0.14:1.10:1.09:2.00 (Example 7)
when normalized with the mole number of Cu of 2.

The electrical resistance of each sample quickly dropped from about 130K and reached 0 (zero) at about 112K, about 111K and about 110K in Examples 6, 7 and 8, respectively. The A.C. magnetic susceptibility of each sample confirmed that this sample could be superconductive at the respective critical temperature or higher. The X-ray diffraction pattern of each sample indicated that the percentage of the high $T_c$ phase was about 80%.

Example 8

To a solution of nitrates of Bi, Pb, Sr, Ca and Cu, ammonium oxalate was added to coprecipitate oxalates in which the molar ratio of Bi:Pb:Sr:Ca:Cu was 1.15:0.30:1.30:1.30:2.00. The coprecipitated oxalates were dried at 100° C., heated at 500° C. to decompose them and ground followed by heating with an electric furnace in the air at 800° C. for 12 hours. Thereafter, the mixture was again ground and pressed under pressure of about 600 kg/cm² to produce a pellet of 20 mm in diameter and 2 mm in thickness. The pellet was sintered with the electric furnace in the air at 850° C. for 24 hours. The grinding and pressing were repeated and the pellet was again sintered with the electric furnace in the air at 850° C. for 48 hours.

With the sintered sample, the molar ratio of the component elements was examined with ICAP to find that the molar ratio of Bi:Pb:Sr:Ca:Cu was 1.098:0.153:1.266:1.243:2.00 when normalized with the mole number of Cu of 2.

Figure 7:
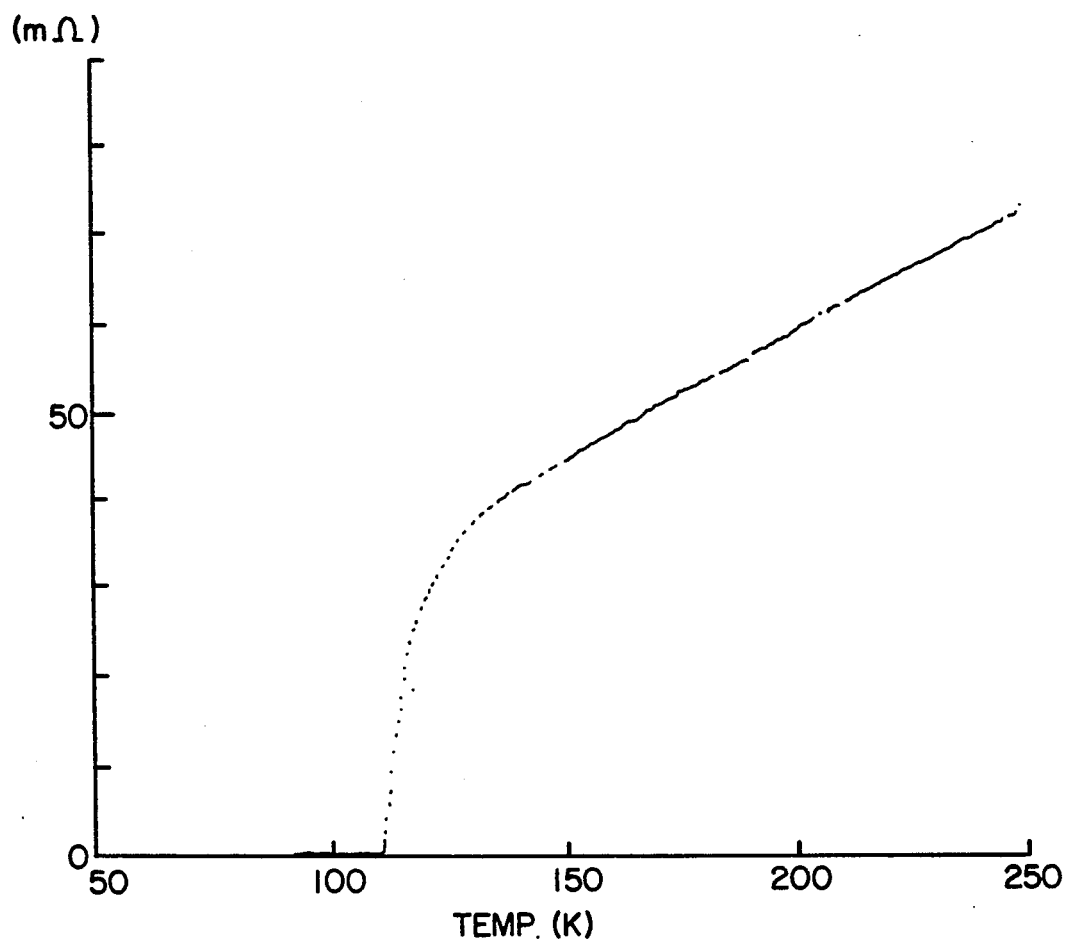
FIG. 7 is a graph showing the temperature dependence of the electrical resistance of the sample prepared in Example 8.
Figure 8:
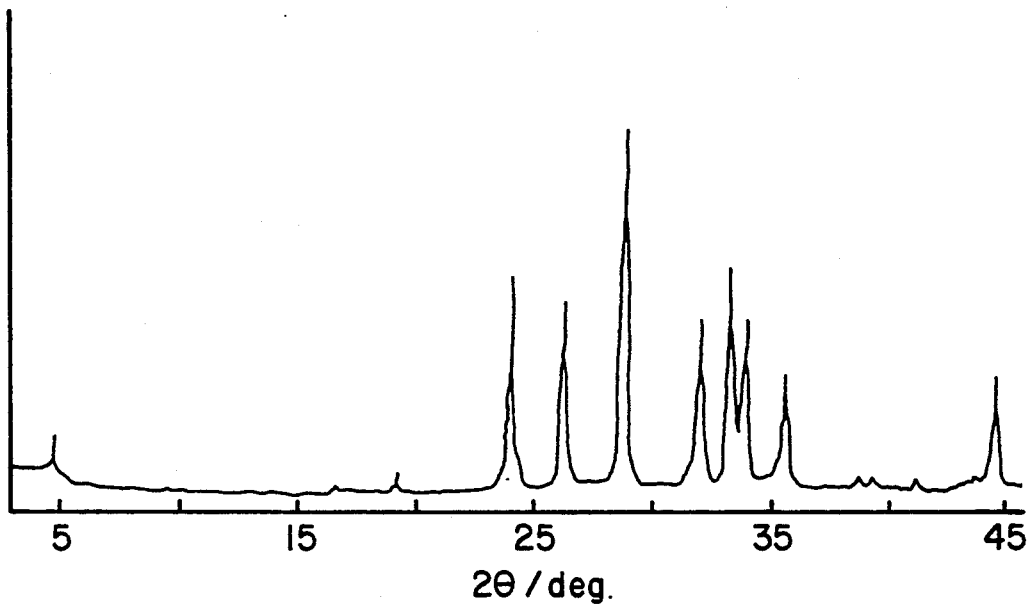
FIG. 8 shows the X-ray diffraction pattern of the sample prepared in Example 8.

The temperature dependence of the electrical resistance of this sample is shown in FIG. 7, from which it is understood that the electrical resistance quickly dropped from about 130K and reached 0 (zero) at about 111K. The X-ray diffraction pattern of this sample is shown in FIG. 8, which indicates that the percentage of the high $T_c$ phase with the c axis of 37 Å was about 98%.

Example 9

To a solution of nitrates of Bi, Pb, Sr, Ca and Cu, ammonium oxalate was added to coprecipitate oxalates in which the molar ratio of Bi:Pb:Sr:Ca:Cu was 1.10:0.35:1.32:1.32:2.00. The coprecipitated oxalates were dried at 100° C., heated at 500° C. to decompose them and ground followed by heating with an electric furnace in the air at 800° C. for 12 hours. Thereafter, the heated mixture was again ground and pressed under pressure of about 1000 kg/cm² to produce a pellet of 20 mm in diameter and 2 mm in thickness. The pellet was sintered with the electric furnace in the air at 850° C. for 120 hours.

With the sintered sample, the molar ratio of the component elements was examined with ICAP to find that the molar ratio of Bi:Pb:Sr:Ca:Cu was 1.075:0.165:1.298:1.285:2.00 when normalized with the mole number of Cu of 2.

Figure 11:
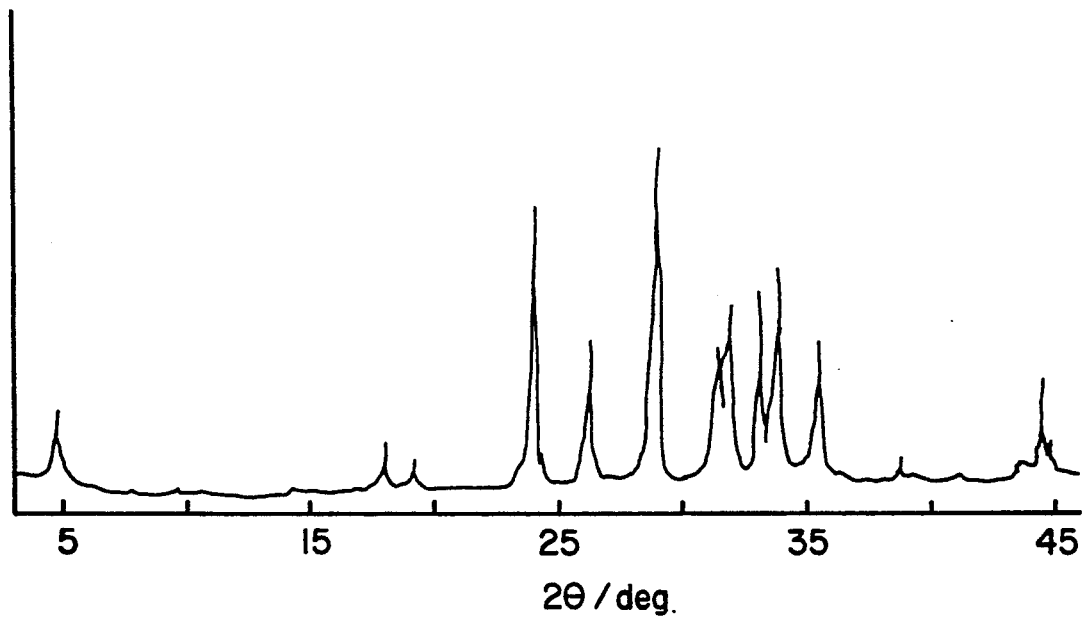
FIG. 11 shows the X-ray diffraction pattern of the sample prepared in Example 9.
Figure 9:
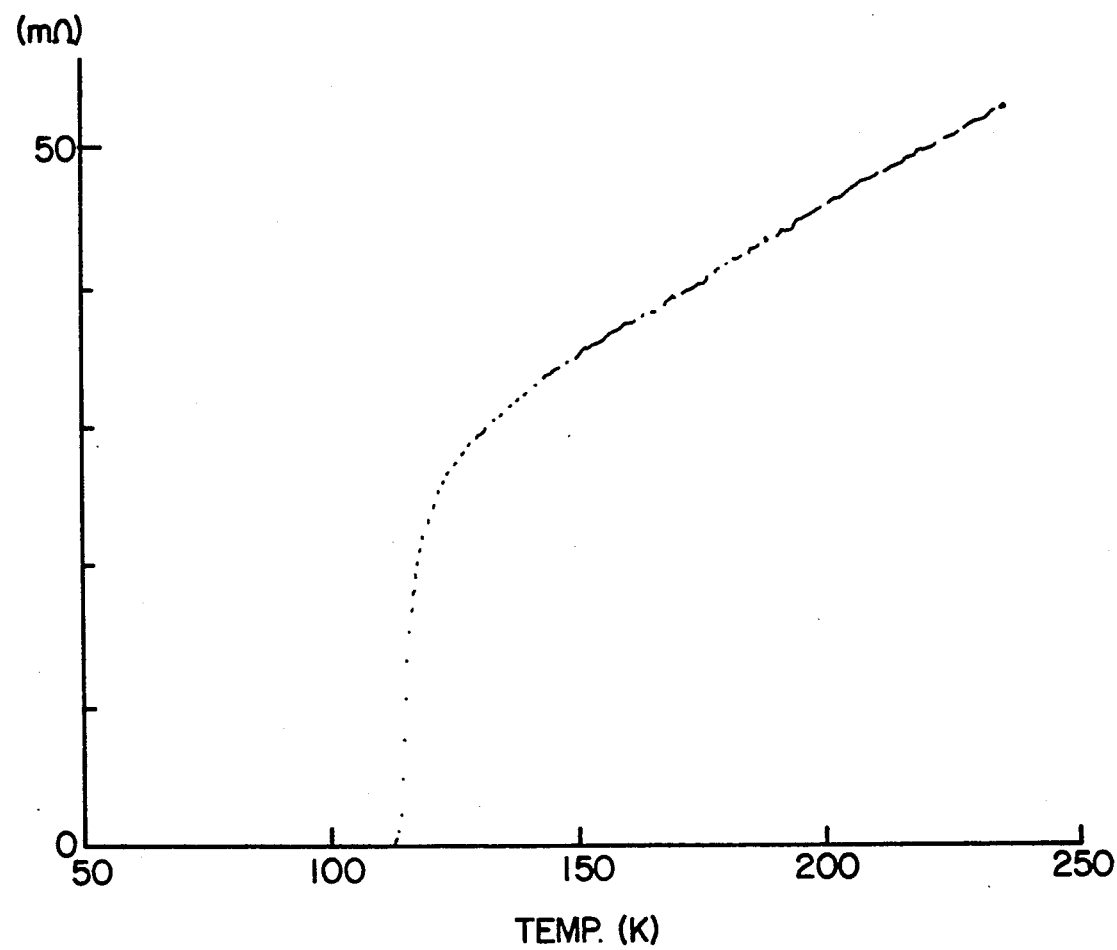
FIG. 9 is a graph showing the temperature dependence of the electrical resistance of the sample prepared in Example 9.
Figure 10:
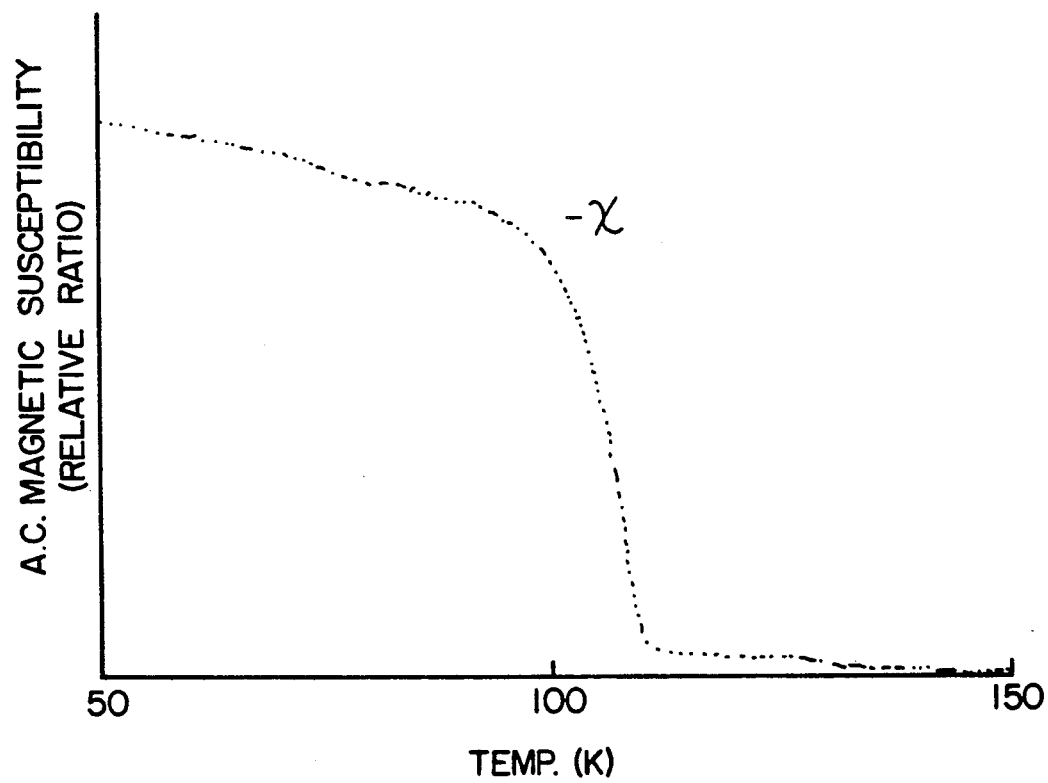
FIG. 10 shows the A.C. magnetic susceptibility of the sample prepared in Example 9.

The temperature dependence of the electrical resistance of this sample is shown in FIG. 9, from which it is understood that the electrical resistance quickly dropped from about 130 K. and reached 0 (zero) at about 112 K. The A.C. magnetic susceptibility of this sample is shown in FIG. 10, which confirms that this sample could be superconductive at about 112 K. or higher. The X-ray diffraction pattern of this sample is shown in FIG. 11, which indicates that the percentage of the high $T_c$ phase with the c axis of 37 Å was about 90%.

Example 10

To a solution of nitrates of Bi, Pb, Sr, Ca and Cu, ammonium oxalate was added to coprecipitate oxalates in which the molar ratio of Bi:Pb:Sr:Ca:Cu was 0.77:0.55:1.24:1.33:2.00. The coprecipitated oxalates were dried at 100° C., heated at 500° C. to decompose them and ground followed by heating with an electric furnace in the air at 800° C. for 12 hours. Thereafter, the mixture was again ground and pressed under pressure of about 600 kg/cm² to produce a pellet of 20 mm in diameter and 2 mm in thickness. The pellet was sintered with the electric furnace in the air at 850° C. for 24 hours. Then, grinding, pressing and formation of a pellet were repeated and again the pellet was sintered with the electric furnace in the air at 850° C. for 80 hours.

With the sintered sample, the molar ratio of the component elements was examined with ICAP to find that the molar ratio of Bi:Pb:Sr:Ca:Cu was 0.725:0.332:1.218:1.295:2.00 when normalized with the mole number of Cu of 2.

Figure 12:
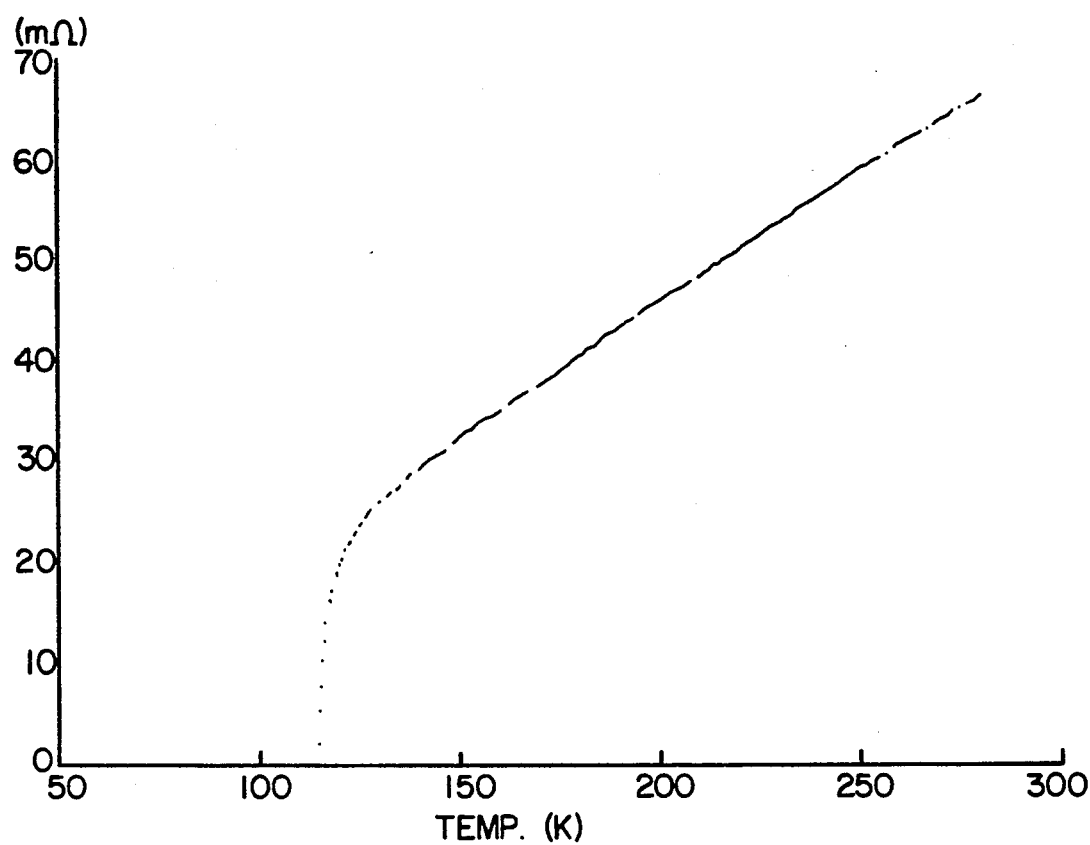
FIG. 12 is a graph showing the temperature dependence of the electrical resistance of the sample prepared in Example 10.
Figure 13:
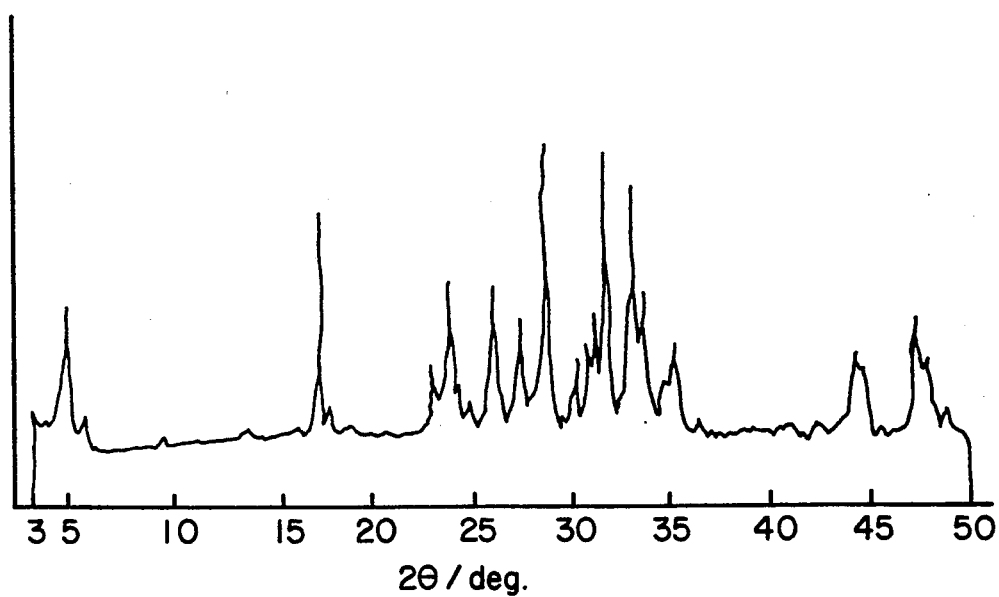
FIG. 13 shows the X-ray diffraction pattern of the sample prepared in Example 10.
Figure 14:
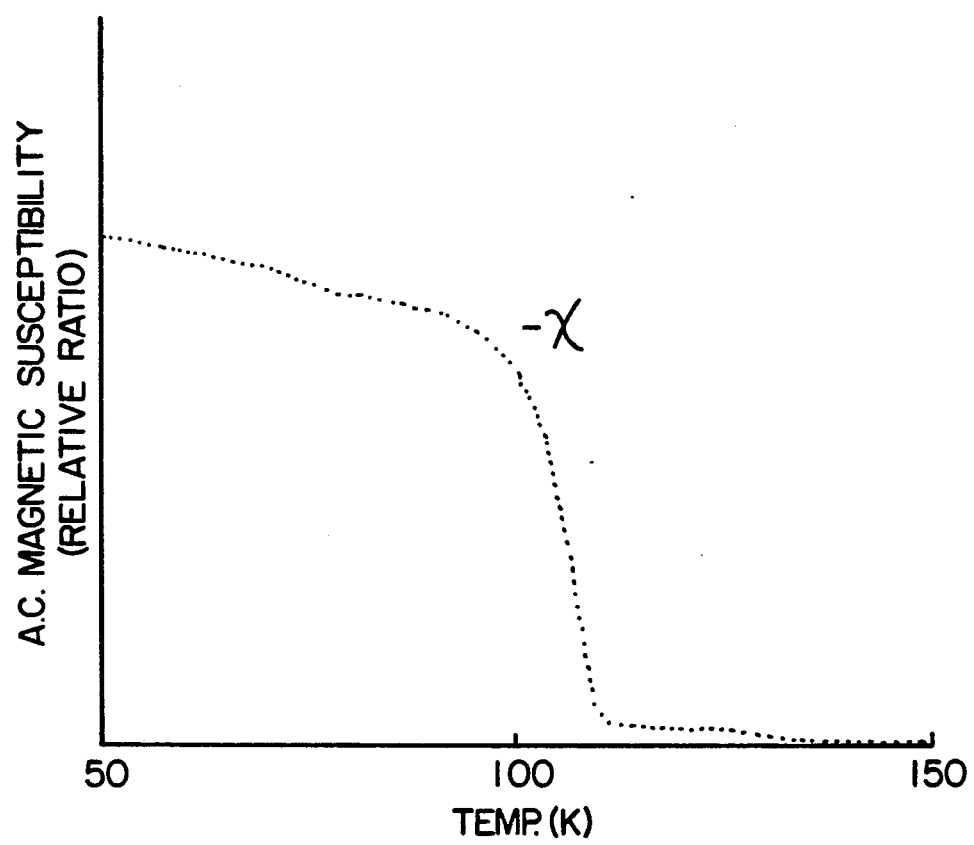
FIG. 14 shows the A.C. magnetic susceptibility of the sample prepared in Example 10.

The temperature dependence of the electrical resistance of this sample is shown in FIG. 12, from which it is understood that the electrical resistance quickly dropped from about 130 K. and reached 0 (zero) at about 112 K. The A.C. magnetic susceptibility of this sample is shown in FIG. 14, which confirms that this sample could be superconductive at about 112 K. or higher. The X-ray diffraction pattern of this sample is shown in FIG. 13, which indicates that the percentage of the high $T_c$ phase with the c axis of 37 Å in this sample was about 70%.

Example 11

In the same manner as in Example 10 but co-precipitating oxalates in which the molar ratio of Bi:Pb:Sr:Ca:Cu was 1.19:0.41:1.24:1.34:2.00 and carrying out the last sintering at 850° C. for 72 hours, a superconductive oxide in which a molar ratio of Bi:Pb:Sr:Ca:Cu was 1.140:0.261:1.223:1.288:2.00 was produced. This sample had a zero resistance critical temperature of about 110 K., the X-ray diffraction pattern of this sample indicated that the percentage of the high $T_c$ phase was about 70%.

What is claimed is:

1. A Bi-Pb-Sr-Ca-Cu-O system superconductor having a Tc higher than 110 K. a composition of $$Bi_n Pb_m Sr_x Ca_y Cu_2 O_\delta$$

wherein n is a number from 0.76 to 1.05, m is a number from 0.01 to 0.20, x is a number from 0.85 to 1.35 and y is a number larger than 1.00 and not larger than 1.35; or n is a number larger than 1.06 and not larger than 1.15, m is a number form 0.12 to 0.25, x is a number from 1.20 to 1.35 and y is a number from 1.20 to 1.30; or n is a number larger than 0.75 and not larger than 1.15, m is a number from 0.25 to 0.35, x is a number from 1.20 to 1.35 and y is a number from 1.20 to 1.35, when they are normalized with the Cu mole number of 2.

2. The Bi-Pb-Sr-Ca-Cu-O system superconductor, of claim 1 wherein in is a further from 0.80 to 0.95, m is a number from 0.04 to 0.20, x is a number from 0.90 to 1.30 and y is a number larger than 1.00 and not larger than 1.30.

3. The Bi-Pb-Sr-Ca-Cu-O system superconductor of claim 1, wherein n is a number larger than 1.06 and not larger than 1.12, m is a number from 0.15 to 0.23, x is a number from 1.25 to 1.35 and y is a number from 1.25 to 1.30.

* * * * *